United States Patent
Yamada et al.

(10) Patent No.: US 8,957,453 B2
(45) Date of Patent: Feb. 17, 2015

(54) METHOD OF MANUFACTURING A SEMICONDUCTOR DEVICE AND SEMICONDUCTOR DEVICE

(71) Applicant: Transphorm Japan, Inc., Yokohama (JP)

(72) Inventors: Atsushi Yamada, Isehara (JP); Kenji Nukui, Nakano (JP)

(73) Assignee: Transphorm Japan, Inc., Yokohama (JP)

( * ) Notice: Subject to any disclaimer, the term of this patent is extended or adjusted under 35 U.S.C. 154(b) by 0 days.

(21) Appl. No.: 13/954,124

(22) Filed: Jul. 30, 2013

(65) Prior Publication Data
US 2014/0091319 A1    Apr. 3, 2014

(30) Foreign Application Priority Data
Sep. 28, 2012    (JP) .................................. 2012-218245

(51) Int. Cl.
| | | |
|---|---|---|
| H01L 31/0328 | (2006.01) | |
| H01L 31/0336 | (2006.01) | |
| H01L 31/072 | (2012.01) | |
| H01L 31/109 | (2006.01) | |
| H01L 29/66 | (2006.01) | |
| H01L 29/20 | (2006.01) | |
| H01L 29/778 | (2006.01) | |
| H01L 29/423 | (2006.01) | |

(52) U.S. Cl.
CPC ...... *H01L 29/66431* (2013.01); *H01L 29/2003* (2013.01); *H01L 29/778* (2013.01); *H01L 29/42372* (2013.01); *H01L 29/66462* (2013.01); *H01L 29/7787* (2013.01)
USPC .................... 257/192; 257/194; 257/E29.246; 257/E29.247

(58) Field of Classification Search
USPC ....... 257/20, 24, 192, 194, E29.246, E29.247
See application file for complete search history.

(56) References Cited

U.S. PATENT DOCUMENTS

| | | | | |
|---|---|---|---|---|
| 8,304,774 B2 * | 11/2012 | Kaya et al. | ...................... | 257/59 |
| 2009/0057720 A1 | 3/2009 | Kaneko | | |
| 2009/0121775 A1 | 5/2009 | Ueda | | |

FOREIGN PATENT DOCUMENTS

| | | |
|---|---|---|
| JP | 2007-19309 A1 | 1/2007 |
| JP | 2009-76845 A1 | 4/2009 |

\* cited by examiner

*Primary Examiner* — Hoai V Pham
(74) *Attorney, Agent, or Firm* — Fish & Richardson P.C.

(57) ABSTRACT

A method of manufacturing a semiconductor device includes laminating and forming an electron transit layer, an electron supplying layer, an etching stop layer, and a p-type film on a substrate sequentially, the p-type film being formed of a nitride semiconductor material that includes Al doped with an impurity element that attains p-type, the etching stop layer being formed of a material that includes GaN, removing the p-type film in an area except an area where a gate electrode is to be formed, by dry etching to form a p-type layer in the area where the gate electrode is to be formed, the dry etching being conducted while plasma emission in the dry etching is observed, the dry etching being stopped after the dry etching is started and plasma emission originating from Al is not observed, and forming the gate electrode on the p-type layer.

19 Claims, 11 Drawing Sheets

METHOD OF MANUFACTURING A SEMICONDUCTOR DEVICE AND SEMICONDUCTOR DEVICE

CROSS-REFERENCE TO RELATED APPLICATIONS

This application claims the benefit of priority based upon Japanese Patent Application No. 2012-218245 filed on Sep. 28, 2012, the entire contents of which are herein incorporated by reference.

FIELD

A certain aspect of the embodiments discussed herein relates to a method of manufacturing a semiconductor device and a semiconductor device.

BACKGROUND

GaN, AlN, or InN that is a nitride semiconductor, a material composed of a mixed crystal thereof, or the like has a higher saturated electron velocity or a wider band gap and is being studied for a higher withstanding voltage or higher output electronic device. For a higher withstanding voltage or higher output electronic device, a technique for a field-effect transistor (FET), in particular, a high electron mobility transistor (HEMT) is developed.

For an HEMT using a nitride semiconductor, a structure is provided in such a manner that an electron transit layer is formed of GaN and an electron supplying layer is formed of AlGaN. In the HEMT with such a structure, a higher concentration of 2-dimensional electron gas (2DEG) is produced by to a distortion caused by a difference between lattice constants of GaN and AlGaN, namely, a piezoelectric polarization, so that it is possible to obtain a semiconductor device with a higher efficiency and a higher output.

Meanwhile, a higher concentration of 2DEG is produced in the HEMT with a structure provided in such a manner that an electron transit layer is formed of GaN and an electron supplying layer is formed of AlGaN, so as to have a problem that it is difficult to attain normally-off-state. In order to solve such a problem, a method is disclosed for removing a part of an electron supplying layer in an area where a gate electrode is to be formed, so that a recess is formed to eliminate a 2DEG immediately below the gate electrode (for example, Japanese Patent Application Publication No. 2009-076845). Furthermore, a method is disclosed for forming a p-GaN layer between a gate electrode and an electron supplying layer so as to suppress production of 2DEG immediately below the gate electrode and thereby attain a normally-off-state (for example, Japanese Patent Application Publication No. 2007-019309).

However, in a method for forming a recess, damage caused by etching at a time when the recess is formed may apply to even the neighborhood of an electron transit layer, and thereby, a characteristic of an HEMT may be degraded by an increase of on-resistance, an increase of leakage current, or the like.

Furthermore, when a p-GaN layer is formed between an electron supplying layer and a gate electrode, the p-GaN layer is generally formed by forming a p-GaN film on an entire surface of the electron supplying layer and subsequently removing the p-GaN film in an area except an area where the gate electrode is to be formed, by dry etching. However, GaN is a material that may be very difficult to apply dry etching thereto, and further, it may be impossible to conduct etching with a higher selection ratio between AlGaN and GaN, so that it may be difficult to remove only a p-GaN layer. Accordingly, a part of a p-GaN layer may remain in an area where the p-GaN layer should be removed or a part of an electron supplying layer may be removed in an area where the p-GaN layer should be removed. In any of such cases, an on-resistance may be increased, so that a characteristic of an HEMT may be degraded. Furthermore, if a deviation of a thickness of an electron supplying layer or the like may be caused by an irregularity of etching in dry etching, an irregularity of a characteristic of an HEMT may also be caused so that a yield thereof may be lowered.

Therefore, a method for manufacturing a semiconductor device that may be capable of having removed only a p-type layer such as a p-GaN layer in an area other than an area where a gate electrode is to be formed, without removing an electron supplying layer, and a semiconductor device manufactured thereby are desired.

SUMMARY

According to an aspect of the embodiments, a method of manufacturing a semiconductor device includes laminating and forming an electron transit layer, an electron supplying layer, an etching stop layer, and a p-type film on a substrate sequentially, the p-type film being formed of a nitride semiconductor material that includes Al doped with an impurity element that attains p-type, the etching stop layer being formed of a material that includes GaN, removing the p-type film in an area except an area where a gate electrode is to be formed, by dry etching to form a p-type layer in the area where the gate electrode is to be formed, the dry etching being conducted while plasma emission in the dry etching is observed, the dry etching being stopped after the dry etching is started and plasma emission originating from Al is not observed, and forming the gate electrode on the p-type layer.

The object and advantages of the invention will be realized and attained by means of the elements and combinations particularly pointed out in the claims. It is to be understood that both the forgoing general description and the following detailed description are exemplary and explanatory and are not restrictive of the invention.

BRIEF DESCRIPTION OF THE DRAWING(S)

FIG. 1 is a structural diagram of a semiconductor device in a first embodiment;

FIG. 2A, FIG. 2B, and FIG. 2C are manufacturing process diagrams (1) of a semiconductor device in the first embodiment;

Figure 7A:
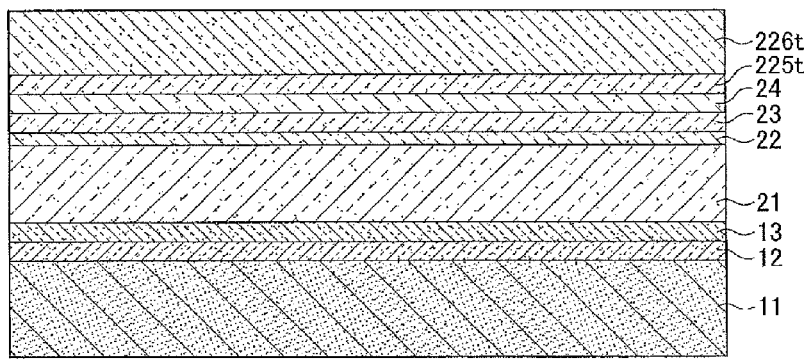
Figure 7B:
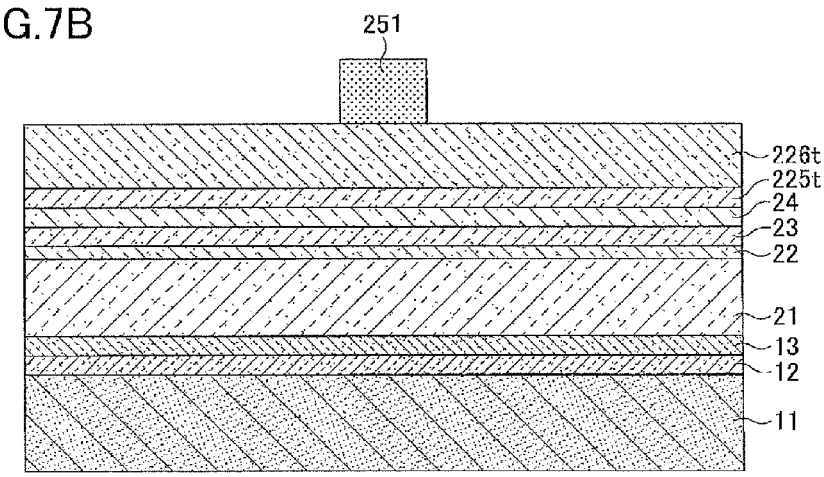
Figure 7C:
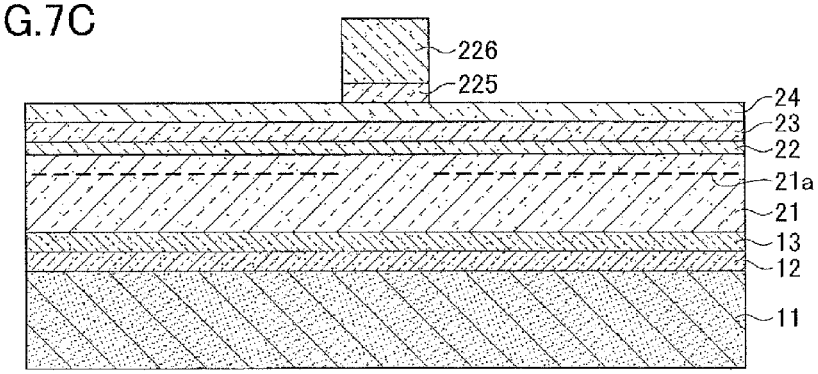
Figure 8A:
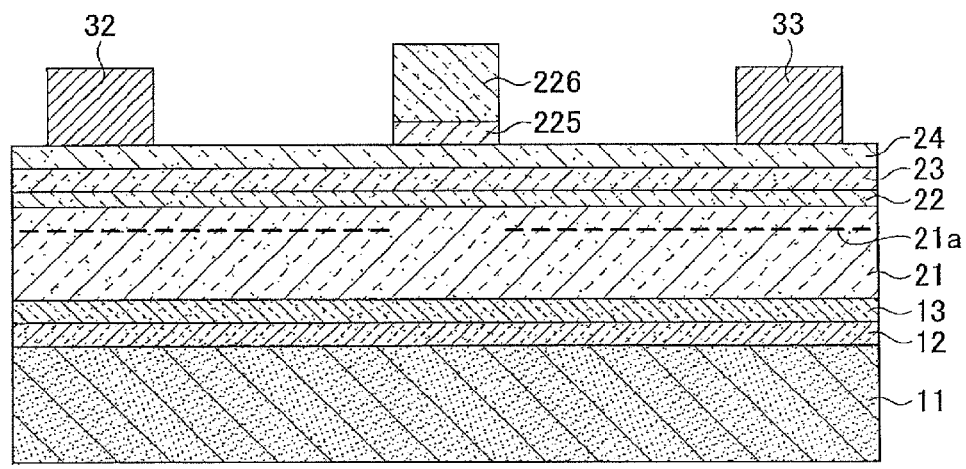
Figure 8B:
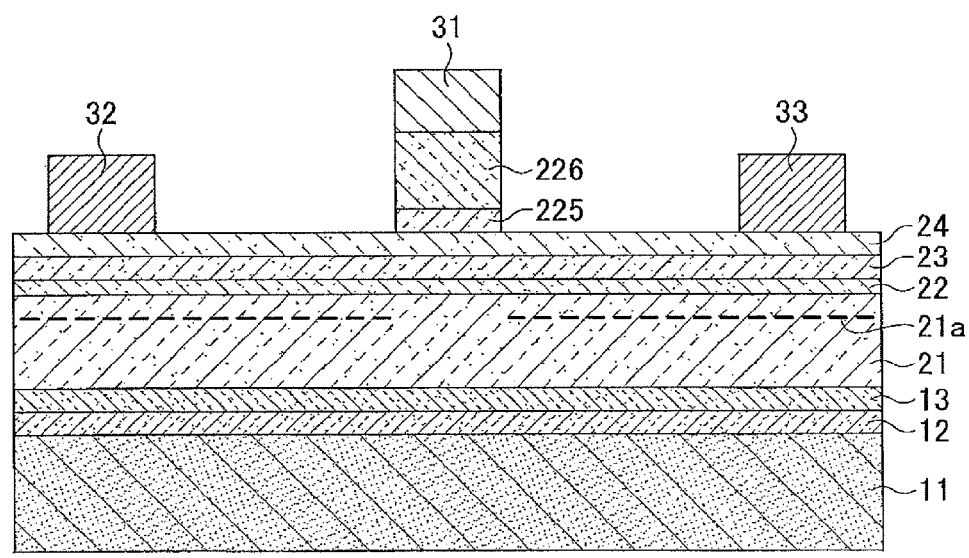
Figure 9:
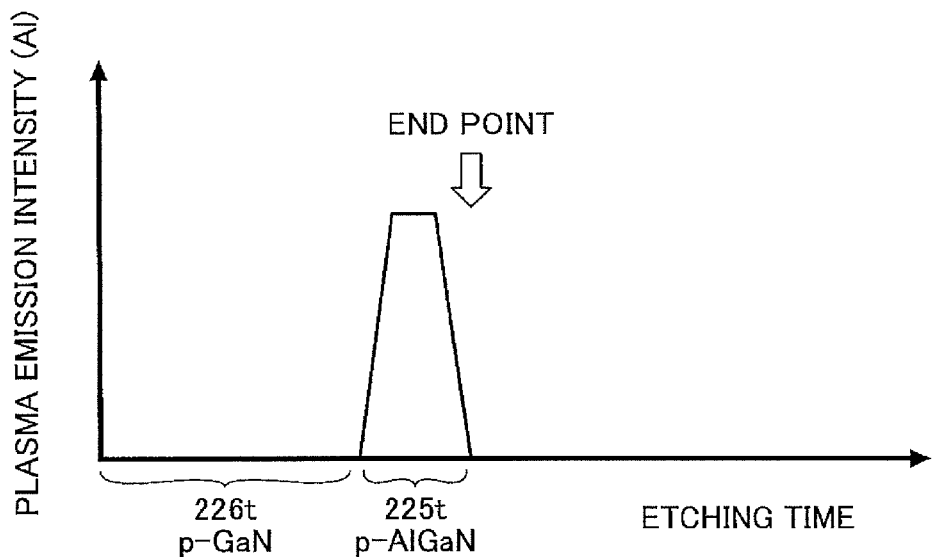
Figure 10:
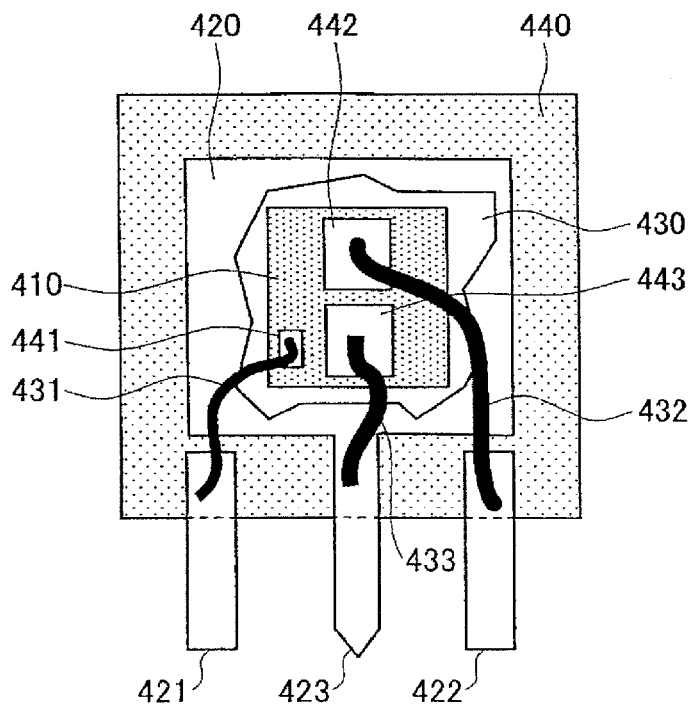
Figure 11:
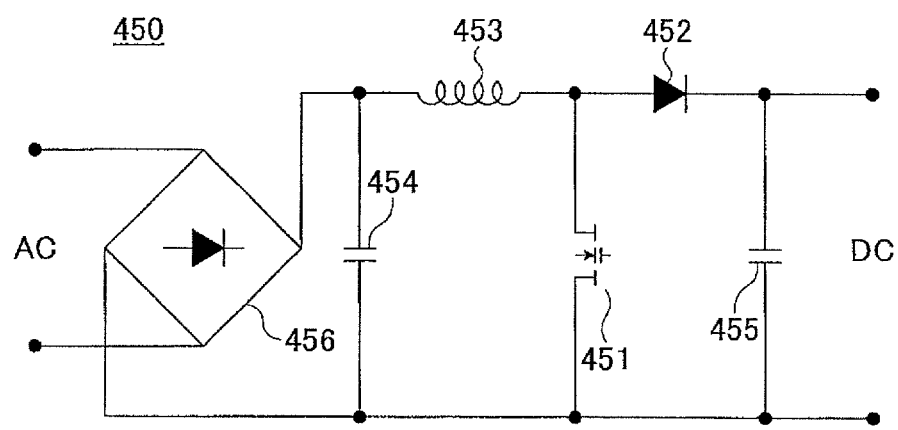
Figure 12:
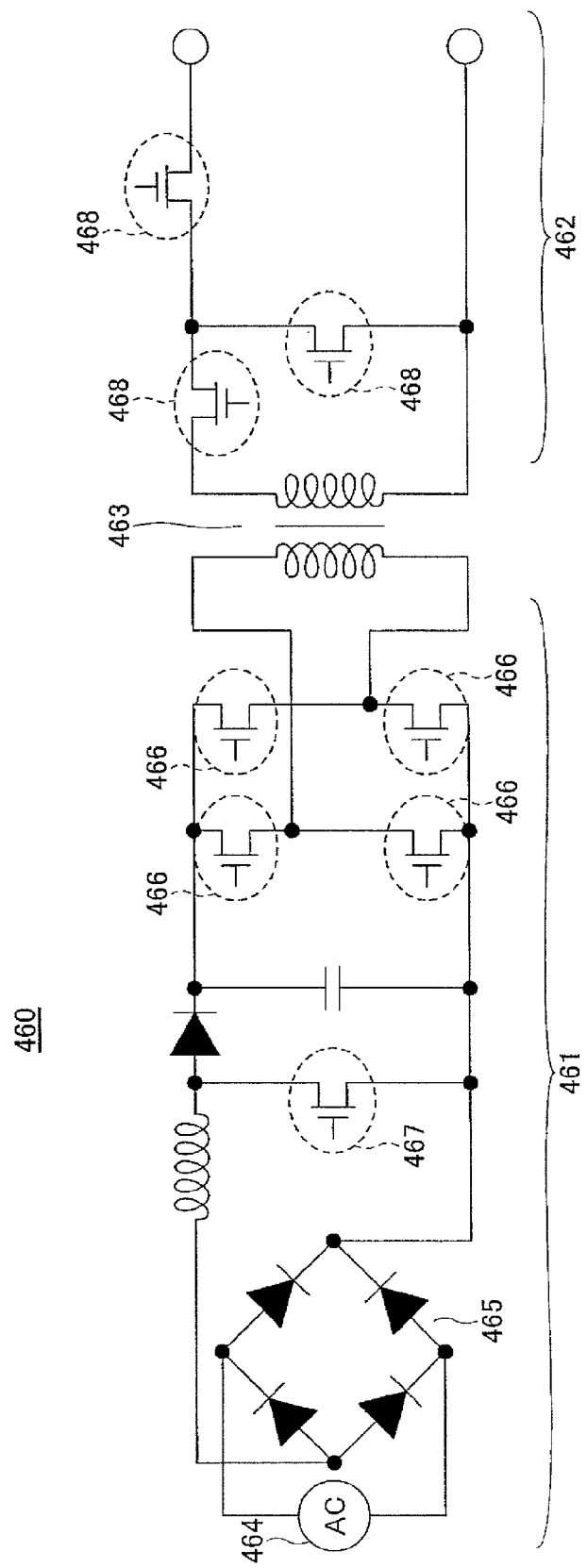
Figure 13:
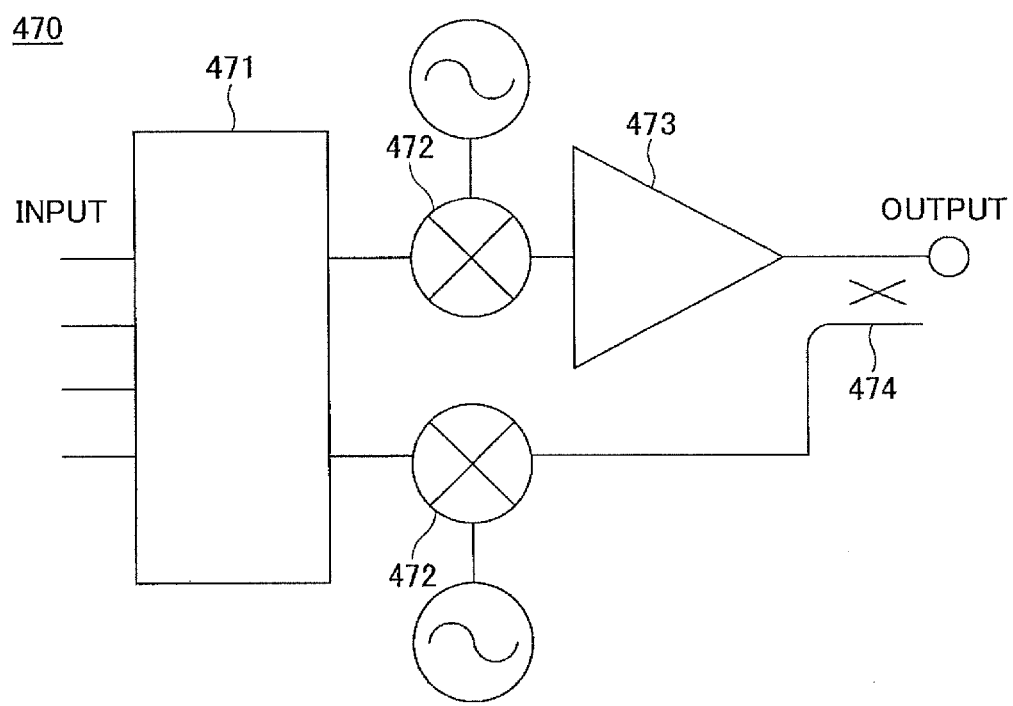

FIG. 7A, FIG. 7B, and FIG. 7C are manufacturing process diagrams (1) of a semiconductor device in the second embodiment;

FIG. 8A and FIG. 8B are manufacturing process diagrams (2) of a semiconductor device in the second embodiment;

FIG. 9 is an illustration diagram of a dry etching process in the second embodiment;

FIG. 10 is an illustration diagram of a discretely packaged semiconductor device in a third embodiment;

FIG. 11 is a circuit diagram of a PFC circuit in the third embodiment;

FIG. 12 is a circuit diagram of a power supply device in the third embodiment; and FIG. 13 is a structural diagram of a high power amplifier in the third embodiment.

DESCRIPTION OF EMBODIMENT(S)

Embodiments for implementing the invention will be described below. Additionally, an identical numeral reference will be provided to an identical member or the like and descriptions thereof will be omitted.

First Embodiment

Semiconductor Device

Figure 1:
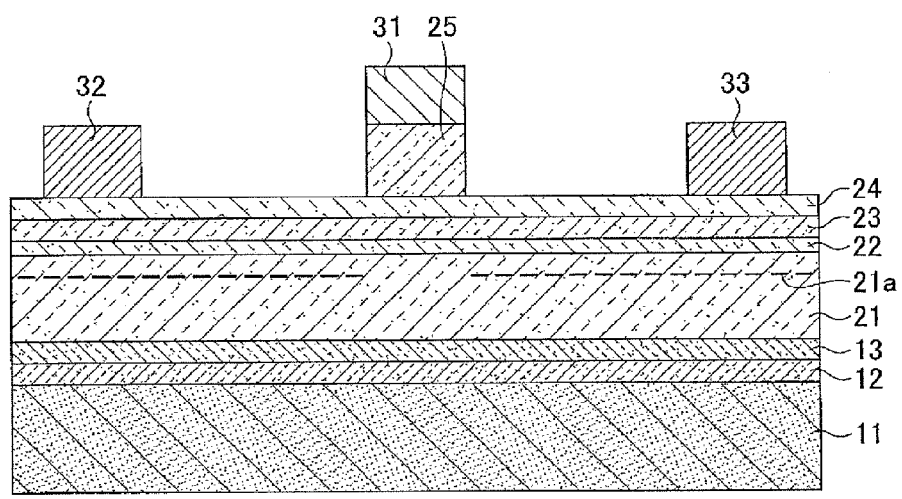

A semiconductor device in a first embodiment will be described. A semiconductor device in the present embodiment is an HEMT with a structure illustrated in FIG. 1.

Specifically, a nucleation layer 12, a buffer layer 13, an electron transit layer 21, a spacer layer 22, an electron supplying layer 23, and an etching stop layer 24 are formed on a substrate 11 composed of a semiconductor or the like. Thereby, 2DEG 21a is generated in the electron transit layer 21 near an interface between the electron transit layer 21 and the spacer layer 22. Furthermore, a p-type layer 25 is formed in an area where a gate electrode 31 is to be formed, on the etching stop layer 24 and the gate electrode 31 is formed on the p-type layer 25. Furthermore, a source electrode 32 and a drain electrode 33 are formed on the etching stop layer 24. Additionally, the source electrode 32 and the drain electrode 33 may be formed by removing the etching stop layer 24 in areas for forming the source electrode 32 and the drain electrode 33 to contact the electron supplying layer 23.

Although an SiC substrate is used for the substrate 11 in the present embodiment, an Si (silicon) substrate, a sapphire substrate, a GaN substrate, or the like may be used and it is also possible to use any of electrically conductive, a semi-insulating, and insulating substrates. The nucleation layer 12 is formed of AlN and the buffer layer 13 is formed of AlGaN. The electron transit layer 21 is formed of i-GaN with a thickness of about 3 μm and the spacer layer 22 is formed of i-AlGaN with a thickness of about 5 nm. The electron supplying layer 23 is formed of n-AlGaN with a thickness of about 30 nm and doped with Si as an impurity element that attains n-type at a concentration of about $5 \times 10^{18}$ cm$^{-3}$. The etching stop layer 24 is formed of i-GaN with a thickness of about 5 nm. The p-type layer 25 is formed of p-$Al_{0.05}Ga_{0.95}N$ with a thickness of about 50 nm and doped with Mg as an impurity element that attains p-type at a concentration of about $4 \times 10^{19}$ cm$^{-3}$. Additionally, the p-type layer 25 is formed of p-$Al_xGa_{1-x}N$, wherein a value of X is $0<X\leq0.1$.

Furthermore, the space layer 22 and the electron supplying layer 23 may be formed of InAlN, wherein, for example, the spacer layer 22 may be formed of i-$In_{0.17}Al_{0.83}N$ and the electron supplying layer 23 may be formed of n-$In_{0.17}Al_{0.83}N$. Furthermore, Be other than Mg may be used as an impurity element that attains p-type.

(Method for Manufacturing a Semiconductor Device)

Next, a method for manufacturing a semiconductor device in the present embodiment will be described based on FIG. 2A, FIG. 2B, FIG. 2C, FIG. 3A, and FIG. 3B.

Figure 2A:
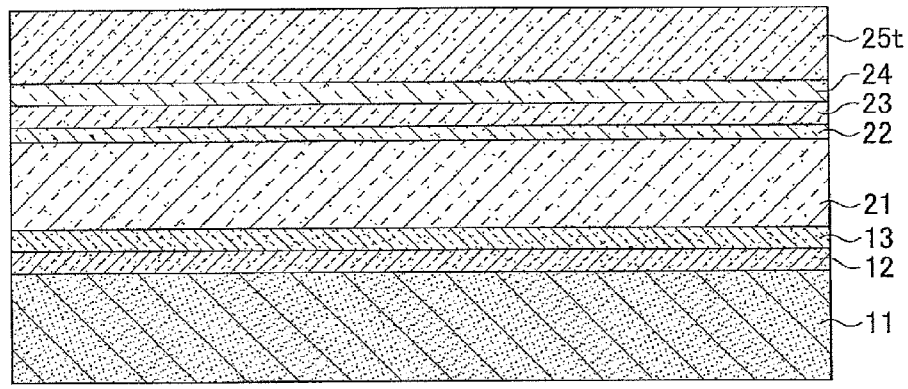

First, nitride semiconductor layers such as a nucleation layer 12, a buffer layer 13, an electron transit layer 21, a spacer layer 22, an electron supplying layer 23, an etching stop layer 24, and a p-type film 25t are sequentially laminated and formed on a substrate 11, as illustrated in FIG. 2A. In the present embodiment, such nitride semiconductor layers are formed by epitaxial growth on Metal-organic Vapor Phase Epitaxy (MOVPE).

Specifically, the nucleation layer 12 is formed of AlN and the buffer layer 13 is formed of AlGaN. The electron transit layer 21 is formed of i-GaN with a thickness of about 3 μm and the spacer layer 22 is formed of i-$Al_{0.3}Ga_{0.7}N$ with a thickness of about 5 nm. The electron supplying layer 23 is formed of n-$Al_{0.3}Ga_{0.7}N$ with a thickness of about 30 nm and doped with Si as an impurity element that attains n-type at a concentration of about $5 \times 10^{18}$ cm$^{-3}$. The etching stop layer 24 is formed of i-GaN with a thickness of about 5 nm. Additionally, the etching stop layer 24 may be n-type or may be p-type.

The p-type film 25t is formed of p-$Al_{0.05}Ga_{0.95}N$ with a thickness of about 50 nm and doped with Mg as an impurity element that attains p-type at a concentration of about $4 \times 10^{19}$ cm$^{-3}$. Additionally, the p-type film 25t is formed of p-$Al_xGa_{1-x}N$, wherein a value of X is $0<X\leq0.1$. In the present embodiment, the p-type film 25t is formed of a material that includes Al because an end point is detected by plasma emission originating from Al, but it is not preferable to include Al more than necessary because a characteristic thereof may be influenced thereby. Hence, the p-type film 25t is formed so that a value of X is less than or equal to 0.1.

When a nitride semiconductor layer is epitaxially grown by MOVPE, trimethylgallium (TMG) is used for a raw material gas of Ga, trimethylaluminum (TMA) is used for a raw material gas of Al, and ammonia ($NH_3$) is used for a raw material gas of N. Furthermore, silane ($SiH_4$) is used for a raw material gas of Si for doping as an impurity element that attains n-type and cyclopentanedienylmagnesium ($CP_2Mg$) is used for a raw material gas of Mg for doping as an impurity element that attains p-type. A rate of feeding of such a raw material gas to be fed into a chamber is adjusted so that it is possible to form a nitride semiconductor layer with a desired composition ratio. Furthermore, such a raw material gas is fed into a chamber of an MOVPE apparatus while hydrogen ($H_2$) is a carrier gas.

Subsequently, a photoresist is applied onto the p-type film 25t and light exposure and development are conducted by a light exposure device so that a not-illustrated resist pattern is formed that has an opening in an area where an element separating area is to be formed. Subsequently, dry etching or ion implantation using a chlorine-containing gas is conducted in a nitride semiconductor layer in an area where a resist pattern is not formed, so that an element separating area that is not illustrated in the figure is formed. Subsequently, the resist pattern is removed by an organic solvent or the like.

Figure 2B:
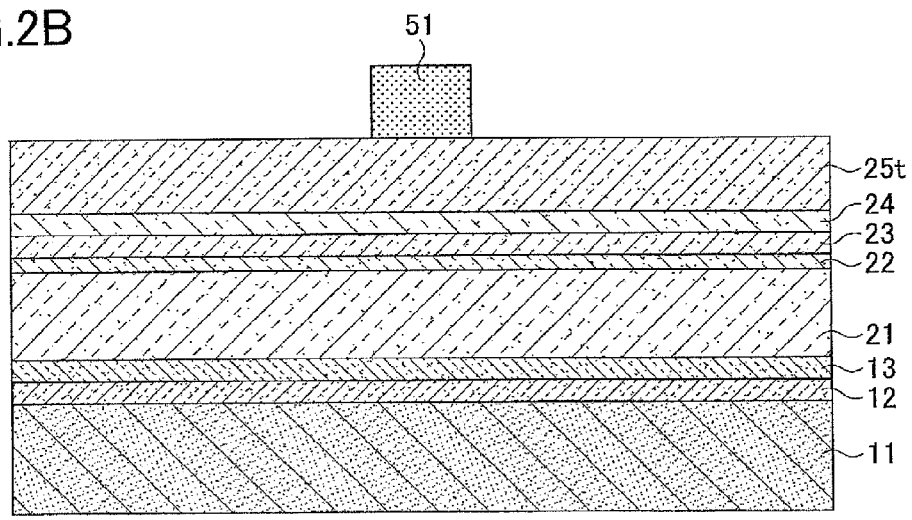

Then, a resist pattern 51 is formed on the p-type film 25t in an area where a p-type layer 25 is to be formed, as illustrated in FIG. 2B. Specifically, a photoresist is applied onto the p-type film 25t and light exposure and development are conducted by a light exposure device so that the resist pattern 51 is formed in an area where a p-type layer 25 is to be formed, that is, an area where a gate electrode 31 is to be formed.

Figure 2C:
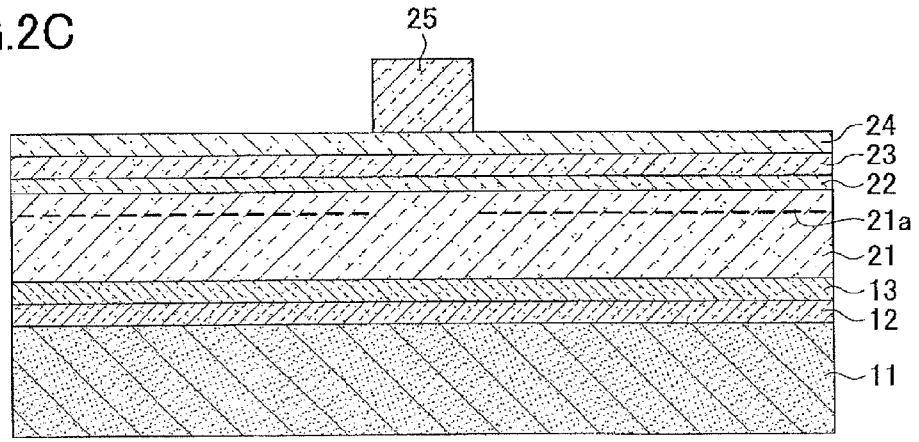

Then, the p-type film 25t in an area where the resist pattern 51 has not been formed is removed by dry etching so that a p-type layer 25 is formed in an area where the resist pattern 51 has been formed, as illustrated in FIG. 2C.

Figure 4:
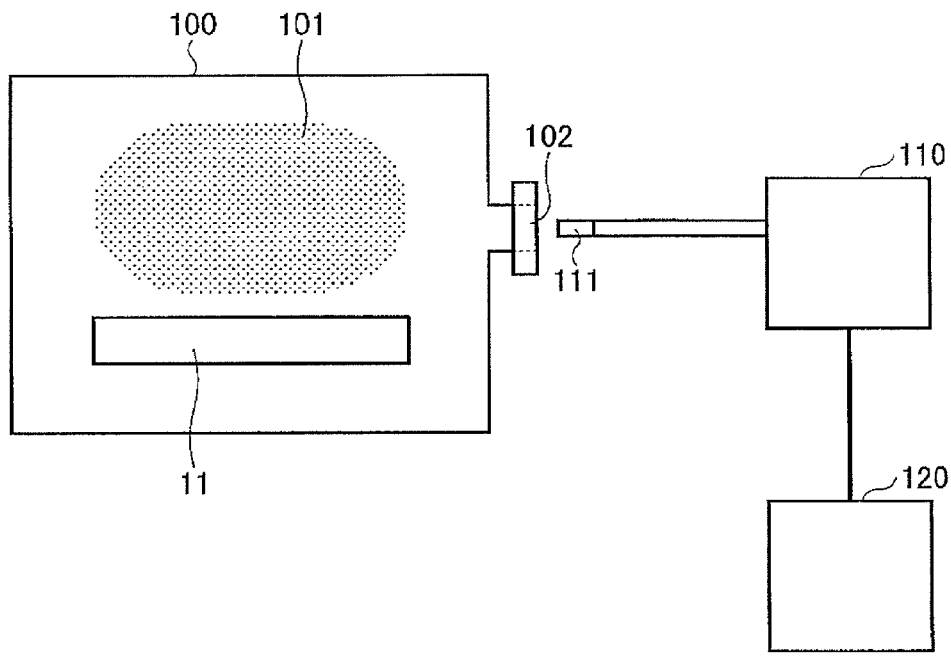
FIG. 4 is a structural diagram of a device for conducting dry etching.

For such dry etching, a dry etching device as illustrated in FIG. 4 is used. Such dry etching is to generate plasma for conducting dry etching, and in the present embodiment, may be described as plasma etching. For such plasma etching, it is possible to provide, for example, Reactive Ion Etching (RIE)

or the like. In the present embodiment, the substrate 11 with a resist pattern formed in an area where the p-type layer 25 has been formed is placed in a chamber 100 of a dry etching device and an etching gas is introduced into the chamber 100 so that plasma 101 is generated to conduct etching. A view port 102 is provided on the chamber 100, wherein it is possible to observe the plasma 101 in an inside of the chamber 100 through the view port 102.

To such a dry etching device, a plasma emission spectrometry end point monitor 110 that is a plasma emission spectroscopic device is connected. In the plasma emission spectroscopy end point monitor 110, it is possible to analyze the kind(s) of an element(s) that is/are included in plasma due to plasma emission. Hence, light of plasma emission from the plasma 101 is received by a light receiving part 111 in the plasma emission spectroscopy end point monitor 110 through the view port 102 and it is possible to know the kind(s) of an element(s) included in the plasma 101 based on received light of plasma emission. Additionally, a control part 120 is connected to the plasma point monitor 110 and further the control part 120 may be to conduct control of a dry etching device.

In the present embodiment, dry etching for forming the p-type layer 25 is conducted while plasma emission from the plasma 101 in the chamber 100 is observed by the plasma emission spectroscopy end point monitor 110. Specifically, dry etching is conduced while an intensity of plasma emission originating from Al in the plasma 101 generated in the chamber 100 is observed.

Figure 5:
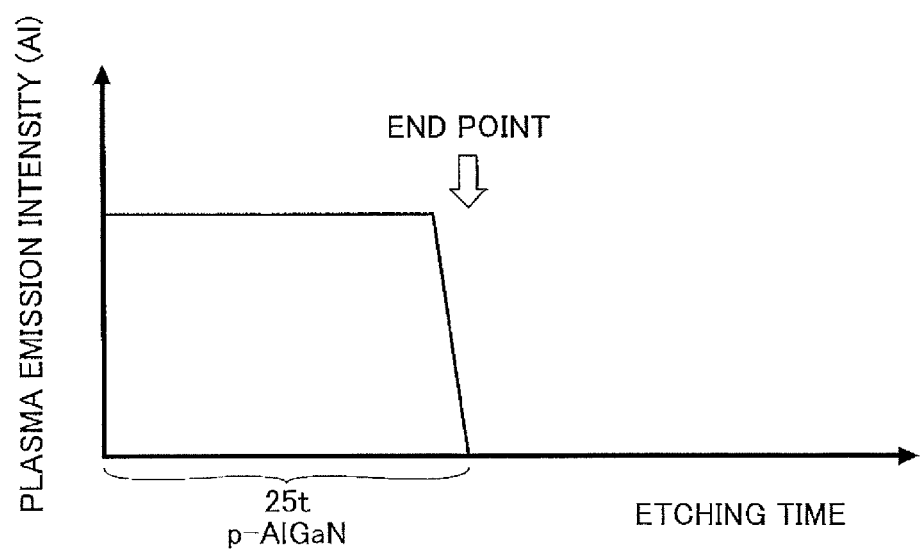
FIG. 5 is an illustration diagram of a dry etching process in the first embodiment.

Such a dry etching process will be described in more detail based on FIG. 5. FIG. 5 illustrates temporal variation of plasma emission originating from Al as observed by the plasma emission spectroscopy end point monitor 110 in the present embodiment.

First, when the plasma 101 is generated to conduct dry etching on a face where the resist pattern 51 has been formed as illustrated in FIG. 2B, the p-type film 25t in an area where the resist pattern 51 has not been formed is removed. The p-type film 25t is formed of p-$Al_{0.05}Ga_{0.95}N$, and accordingly, includes Al. Hence, plasma emission originating from Al is observed in the plasma emission spectroscopy end point monitor 110 when the p-type film 25t is being removed by dry etching, as illustrated in FIG. 5.

Subsequently, as the p-type film 25t in an area where the resist pattern 51 has not been formed is removed, etching of the etching stop layer 24 formed under the p-type film 25t is started. The etching stop layer 24 is formed of i-GaN, and accordingly, does not include Al. Hence, plasma emission originating from Al is not observed in the plasma emission spectroscopy end point monitor 110 as illustrated in FIG. 5. Thus, a condition that plasma emission originating from Al is no longer observed is an end point where dry etching is stopped.

Thereby, it is possible to remove the p-type film 25t sufficiently in an area where the resist pattern 51 has not been formed and it is possible to form a p-type layer 25 in an area where the resist pattern 51 has been formed, as illustrated in FIG. 2C. Furthermore, dry etching is stopped on a condition that the etching stop layer 24 is exposed in an area where the resist pattern 51 has not been formed. Therefore, the electron supplying layer 23 formed under the etching stop layer 24 is not etched and the electron supplying layer 23 is not damaged by dry etching.

In the present embodiment, it is possible to cause a 2DEG 21a just under an area where the p-type layer 25 has been formed to be absent without reducing the 2DEG 21a just under an area where the p-type layer 25 has not been formed. Therefore, it is possible to obtain a normally-off type HEMT with a lower on-resistance. Additionally, the p-type film 25t in the present embodiment is formed of a material that includes Al, because an end point is determined based on whether or not plasma emission originating from Al is being detected in the plasma emission spectroscopy end point monitor 110. However, it is preferable for the p-type film 25t to be formed of p-$Al_xGa_{1-x}N$ at a composition ratio that has a value of X being $0<X\leq0.1$, because a characteristic may be degraded when a composition ratio of Al is greater.

Furthermore, it is preferable for a film thickness of the etching stop layer 24 to be greater than or equal to 5 nm and less than or equal to 15 nm in order to remove the p-type film 25t sufficiently in an area where the resist pattern 51 has not been formed while the electron supplying layer 23 is not influenced by dry etching. If a film thickness of the etching stop layer 24 is less than 5 nm, the etching stop layer 24 may be removed or a part of the electron supplying layer 23 may also be removed, due to irregularity of etching or the like, before the p-type film 25t in an area where the resist pattern 51 has not been formed is sufficiently removed. Furthermore, if the etching stop layer 24 is thicker, an effect of forming the p-type layer 25 may be mitigated and it may be difficult to form a normally-off type, so that it is preferable for a film thickness of the etching stop layer 24 to be less than or equal to 15 nm.

Additionally, over-etching may be conducted for the etching stop layer 24 according to need. Furthermore, even if a part of the etching stop layer 24 remains on an area where the resist pattern 51 has not been formed, a characteristic of an HEMT is not influenced. Subsequently, the resist pattern 51 is removed by an organic solvent or the like so that it is possible to obtain a structure as illustrated in FIG. 2C.

Figure 3A:
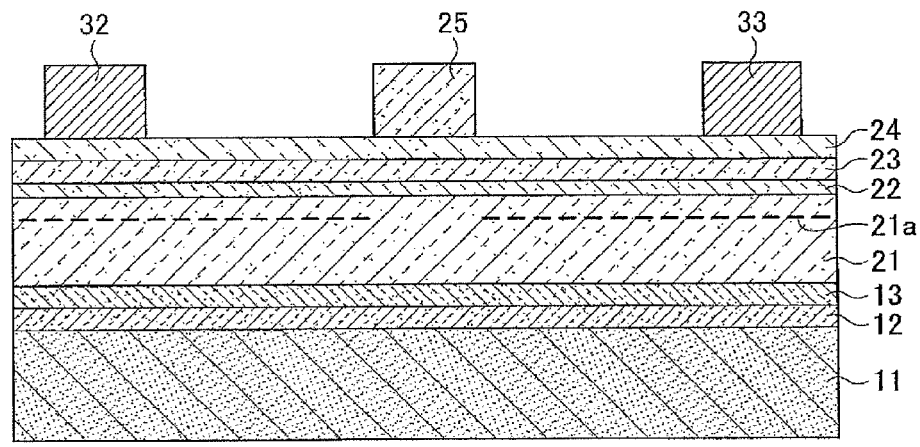
FIG. 3A and FIG. 3B are manufacturing process diagrams (2) of a semiconductor device in the first embodiment.

Then, a source electrode 32 and a drain electrode 33 are formed on the etching stop layer 24, as illustrated in FIG. 3A.

Specifically, a photoresist is applied onto the p-type layer 25 and the etching stop layer 24 and light exposure and development are conducted by a light exposure device, so that a resist pattern having openings in areas for forming the source electrode 32 and the drain electrode 33 are formed. Subsequently, a metal laminated film formed of Ta/Al (film thicknesses, Ta: 200 nm and Al: 200 nm) is film-formed by vacuum deposition, and afterward, dipped in an organic solvent, so that a metal laminated film formed on the resist pattern is removed with the resist pattern by lift-off. Thereby, the source electrode 32 and the drain electrode 33 are formed of a remaining metal laminated film. Subsequently, heat treatment is conducted at a temperature of 400° C.-1000° C., for example, at a temperature of 550° C., in nitrogen atmosphere, so that an ohmic contact is provided. Additionally, when it is possible to provide an ohmic contact without conducting heat treatment, no heat treatment may be conducted. Additionally, a description of Ta/Al means a bilayer metal laminated film wherein a lower layer is Ta and an upper layer is Al. Furthermore, when the source electrode 32 and the drain electrode 33 are formed, the source electrode 32 and the drain electrode 33 may be formed after the etching stop layer 24 and a part of the electron supplying layer 23 in areas for forming the source electrode 32 and the drain electrode 33 are removed.

Figure 3B:
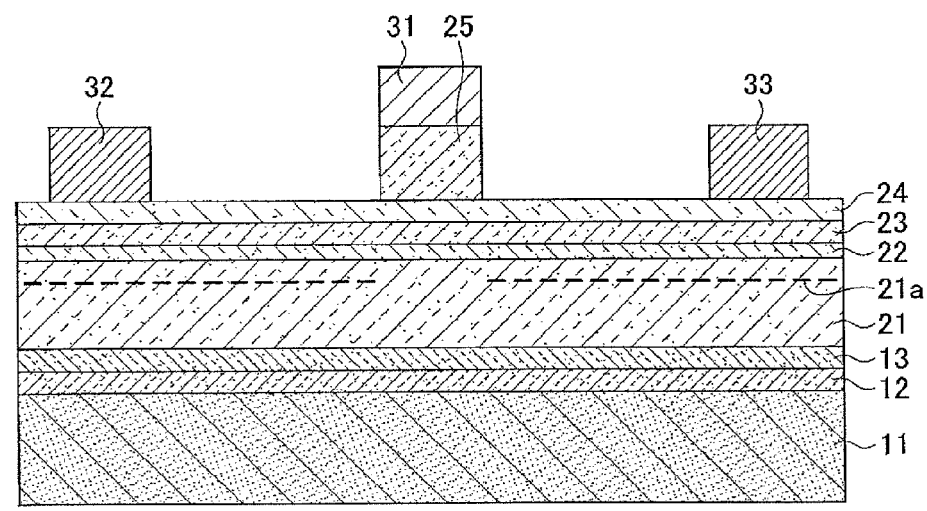

Then, a gate electrode 31 is formed on the p-type layer 25 as illustrated in FIG. 3B.

Specifically, a photoresist is applied onto the p-type layer 25 and the etching stop layer 24 and light exposure and development are conducted by a light exposure device, so that a resist pattern is formed that has an opening in an area where the gate electrode 31 is to be formed. Subsequently, a metal laminated film formed of Ni/Au (film thicknesses, Ni: 30 nm and Au: 400 nm) is film-formed by vacuum deposition, and afterward, dipped in an organic solvent, so that a metal laminated film formed on the resist pattern is removed with the resist pattern by lift-off. Thereby, the gate electrode 31 is formed of a metal laminated film remaining on the p-type layer 25. Subsequently, heat treatment may be conducted according to need.

The gate electrode 31, the source electrode 32, and the drain electrode 33 may be a combination of metallic materials other than those described above, may be structures other than those described above, and may be formed of a monolayer metal film. Furthermore, for a method for forming the source electrode 31, the source electrode 32, and the drain electrode 33, formation thereof may be conducted by a method other than those described above.

As described above, it is possible to fabricate a semiconductor device in the present embodiment.

Second Embodiment

Semiconductor Device

Figure 6:
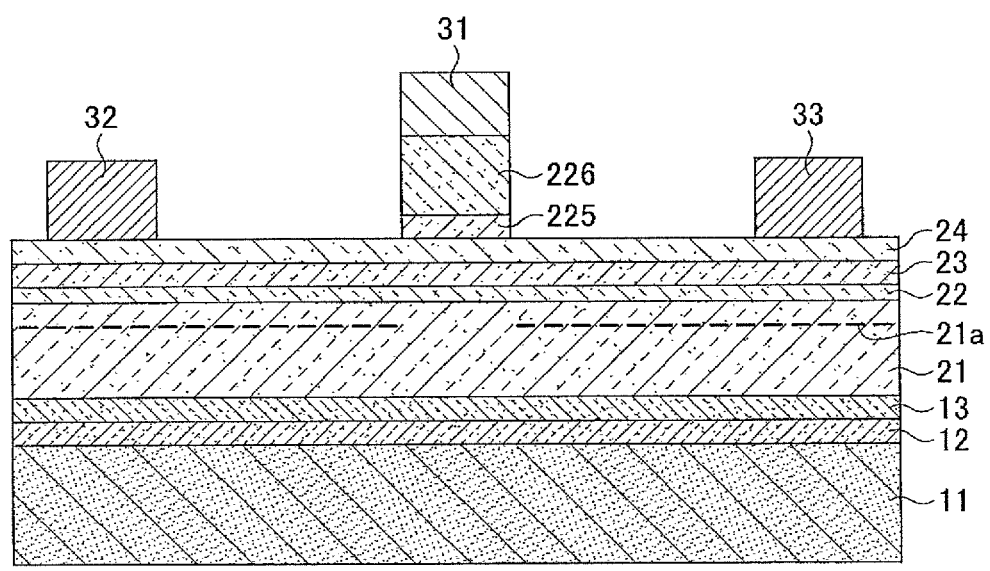
FIG. 6 is a structural diagram of a semiconductor device in a second embodiment.

Next, a semiconductor device in a second embodiment will be described. A semiconductor device in the present embodiment is an HEMT with a structure illustrated in FIG. 6.

Specifically, a nucleation layer 12, a buffer layer 13, an electron transit layer 21, a spacer layer 22, an electron supplying layer 23, and an etching stop layer 24 are formed on a substrate 11 composed of a semiconductor or the like. Thereby, 2DEG 21a is generated in the electron transit layer 21 near an interface between the electron transit layer 21 and the spacer layer 22. Furthermore, a first p-type layer 225 and a second p-type layer 226 are laminated and formed in an area where a gate electrode 31 is to be formed, on the etching stop layer 24, and the gate electrode 31 is formed on the second p-type layer 226. Furthermore, a source electrode 32 and a drain electrode 33 are formed on the etching stop layer 24. Additionally, the source electrode 32 and the drain electrode 33 may be formed by removing the etching stop layer 24 in areas for forming the source electrode 32 and the drain electrode 33 to contact the electron supplying layer 23.

Although an SiC substrate is used for the substrate 11 in the present embodiment, an Si substrate, a sapphire substrate, a GaN substrate, or the like may be used and it is also possible to use any of electrically conductive, a semi-insulating, and insulating substrates. The nucleation layer 12 is formed of AlN and the buffer layer 13 is formed of AlGaN. The electron transit layer 21 is formed of i-GaN with a thickness of about 3 μm and the spacer layer 22 is formed of i-$Al_{0.3}Ga_{0.7}N$ with a thickness of about 5 nm. The electron supplying layer 23 is formed of n-$Al_{0.3}Ga_{0.7}N$ with a thickness of about 30 nm and doped with Si as an impurity element that attains n-type at a concentration of about $5\times10^{18}$ cm$^{-3}$. The etching stop layer 24 is formed of i-GaN with a thickness of about 5 nm. The first p-type layer 225 is formed of p-$Al_{0.05}Ga_{0.95}N$ with a thickness of about 10 nm and doped with Mg as an impurity element that attains p-type at a concentration of about $4\times10^{19}$ cm$^{-3}$. The second p-type layer 226 is formed of p-GaN with a thickness of about 30 nm and doped with Mg as an impurity element that attains p-type at a concentration of about $4\times10^{19}$ cm$^{-3}$. Additionally, the first p-type layer 225 is formed of p-$Al_xGa_{1-x}N$, wherein a value of X is 0<X≤0.1.

In general, there is a possibility of generating 2DEG in a case where a p-$Al_xGa_{1-x}N$ layer formed on a GaN layer that is the etching stop layer 24 is thick. Hence, two layers such as the first p-type layer 225 formed of p-$Al_{0.05}Ga_{0.95}N$ with a thickness of about 10 nm and the second p-type layer 226 formed of p-GaN with a thickness of about 30 nm are formed on the etching stop layer 24 in the present embodiment.

Furthermore, the space layer 22 and the electron supplying layer 23 may be formed of InAlN, wherein, for example, the spacer layer 22 may be formed of i-$In_{0.17}Al_{0.83}N$ and the electron supplying layer 23 may be formed of n-$In_{0.17}Al_{0.83}N$. Furthermore, Be other than Mg may be used as an impurity element that attains p-type.

(Method for Manufacturing a Semiconductor Device)

Next, a method for manufacturing a semiconductor device in the present embodiment will be described based on FIG. 7A, FIG. 7B, FIG. 7C, FIG. 8A, and FIG. 8B.

First, nitride semiconductor layers such as a nucleation layer 12, a buffer layer 13, an electron transit layer 21, a spacer layer 22, an electron supplying layer 23, an etching stop layer 24, a first p-type film 225t, and a second p-type film 226t are sequentially laminated and formed on a substrate 11, as illustrated in FIG. 7A. In the present embodiment, such nitride semiconductor layers are formed by epitaxial growth on MOVPE.

Specifically, the nucleation layer 12 is formed of AlN and the buffer layer 13 is formed of AlGaN. The electron transit layer 21 is formed of i-GaN with a thickness of about 3 μm and the spacer layer 22 is formed of i-$Al_{0.3}Ga_{0.7}N$ with a thickness of about 5 nm. The electron supplying layer 23 is formed of n-$Al_{0.3}Ga_{0.7}N$ with a thickness of about 30 nm and doped with Si as an impurity element that attains n-type at a concentration of about $5\times10^{18}$ cm$^{-3}$. The etching stop layer 24 is formed of i-GaN with a thickness of about 5 nm. Additionally, the etching stop layer 24 may be n-type or may be p-type.

A first p-type layer 225 is formed of p-$Al_{0.05}Ga_{0.95}N$ with a thickness of about 10 nm and doped with Mg as an impurity element that attains p-type at a concentration of about $4\times10^{19}$ cm$^{-3}$. A second p-type layer 226 is formed of p-GaN with a thickness of about 30 nm and doped with Mg as an impurity element that attains p-type at a concentration of about $4\times10^{19}$ cm$^{-3}$. Additionally, the first p-type layer 225 is formed of p-$Al_xGa_{1-x}N$, wherein a value of X is 0<X≤0.1. In the present embodiment, the first p-type film 225t is formed of a material that includes Al because an end point is detected by plasma emission originating from Al, but it is not preferable to include Al more than necessary because a characteristic thereof may be influenced thereby. Hence, the first p-type film 225t is formed so that a value of X is less than or equal to 0.1.

When a nitride semiconductor layer is epitaxially grown by MOVPE, trimethylgallium (TMG) is used for a raw material gas of Ga, trimethylaluminum (TMA) is used for a raw material gas of Al, and ammonia (NH$_3$) is used for a raw material gas of N. Furthermore, silane (SiH$_4$) is used for a raw material gas of Si for doping as an impurity element that attains n-type and cyclopentadienylmagnesium (CP$_2$Mg) is used for a raw material gas of Mg for doping as an impurity element that attains p-type. A rate of feeding of such a raw material gas to be fed into a chamber is adjusted so that it is possible to form a nitride semiconductor layer with a desired composition ratio. Furthermore, such a raw material gas is fed into a chamber of an MOVPE apparatus while hydrogen (H$_2$) is a carrier gas.

Subsequently, a photoresist is applied onto the second p-type film 226t and light exposure and development are conducted by a light exposure device so that a not-illustrated resist pattern is formed that has an opening in an area where an element separating area is to be formed. Subsequently, dry etching or ion implantation using a chlorine-containing gas is conducted in a nitride semiconductor layer in an area where a resist pattern is not formed, so that an element separating area that is not illustrated in the figure is formed. Subsequently, the resist pattern is removed by an organic solvent or the like.

Then, a resist pattern 251 is formed on the second p-type film 226t, as illustrated in FIG. 7B. Specifically, a photoresist is applied onto the second p-type film 226t and light exposure and development are conducted by a light exposure device so that a resist pattern 251 is formed in an area where a first p-type layer 225 and a second p-type layer 226 are to be formed, that is, an area where a gate electrode 31 is to be formed.

Then, the second p-type film 226t and the first p-type film 225t in an area where the resist pattern 251 has not been formed are removed by dry etching, as illustrated in FIG. 7C. Thereby, a first p-type layer 225 and a second p-type layer 226 are formed in an area where the resist pattern 251 has been formed. For dry etching in the present embodiment, a dry etching device as illustrated in FIG. 4 is used similarly to the first embodiment.

In the present embodiment, dry etching for forming the first p-type layer 225 and the second p-type layer 226 is conducted while plasma emission from plasma 101 in a chamber 100 is observed by a plasma emission spectroscopy end point monitor 110, similarly to the first embodiment. Specifically, dry etching is conducted while an intensity of plasma emission originating from Al in the plasma 101 generated in the chamber 100 is observed.

Such a dry etching process will be described in more detail based on FIG. 9. FIG. 9 illustrates temporal variation of plasma emission originating from Al as observed by the plasma emission spectroscopy end point monitor 110 in the present embodiment.

First, when the plasma 101 is generated to conduct dry etching on a face where the resist pattern 251 has been formed as illustrated in FIG. 7B, the second p-type film 226t in an area where the resist pattern 251 has not been formed is removed. The second p-type film 226t is formed of p-GaN, and accordingly, does not include Al. Hence, plasma emission originating from Al is not observed in the plasma emission spectroscopy end point monitor 110 when the second p-type film 226t is being removed by dry etching, as illustrated in FIG. 9.

Subsequently, as the second p-type film 226t in an area where the resist pattern 251 has not been formed is removed, etching of the first p-type film 225t formed under the second p-type film 226t is started. The first p-type film 225t is formed of p-Al$_{0.05}$Ga$_{0.95}$N, and accordingly, includes Al. Hence, plasma emission originating from Al is observed in the plasma emission spectroscopy end point monitor 110 when the first p-type film 225t is being removed by dry etching, as illustrated in FIG. 9.

Subsequently, as the first p-type film 225t in an area where the resist pattern 251 has not been formed is removed, etching of an etching stop layer 24 formed under the first p-type film 225t is started. The etching stop layer 24 is formed of i-GaN, and accordingly, does not include Al. Hence, plasma emission originating from Al is not observed in the plasma emission spectroscopy end point monitor 110 as illustrated in FIG. 9. Thus, a condition that plasma emission originating from Al is no longer observed is an end point where dry etching is stopped.

Thereby, it is possible to remove the first p-type film 225t and the second p-type film 226t sufficiently in an area where the resist pattern 251 has not been formed, as illustrated in FIG. 7C. Hence, a first p-type layer 225 and a second p-type layer 226 are formed in an area where the resist pattern 251 has been formed. Furthermore, dry etching is stopped on a condition that the etching stop layer 24 is exposed in an area where the resist pattern 251 has not been formed. Therefore, the electron supplying layer 23 formed under the etching stop layer 24 is not etched and the electron supplying layer 23 is not damaged by dry etching.

In the present embodiment, it is possible to cause a 2DEG 21a just under an area where the first p-type layer 225 and the second p-type layer 226 have been formed to be absent without reducing the 2DEG 21a just under an area where the first p-type layer 225 and the second p-type layer 226 have not been formed. Therefore, it is possible to obtain a normally-off type HEMT with a lower on-resistance. Additionally, the first p-type film 225t in the present embodiment is formed of a material that includes Al, because an end point is determined based on whether or not plasma emission originating from Al is being detected in the plasma emission spectroscopy end point monitor 110. However, it is preferable for the first p-type film 225t to be formed of p-Al$_X$Ga$_{1-X}$N at a composition ratio that has a value of X being 0<X≤0.1, because a characteristic may be degraded when a composition ratio of Al is greater. Furthermore, it is preferable for a film thickness of the first p-type film 225t to be greater than or equal to 5 nm and less than or equal to 15 nm in order to detect an end point more accurately.

Furthermore, it is preferable for a film thickness of the etching stop layer 24 to be greater than or equal to 5 nm and less than or equal to 15 nm in order to remove the first p-type film 225t sufficiently in an area where the resist pattern 251 has not been formed while the electron supplying layer 23 is not influenced by dry etching. If a film thickness of the etching stop layer 24 is less than 5 nm, the etching stop layer 24 may be removed or a part of the electron supplying layer 23 may also be removed, due to irregularity of etching or the like, before the first p-type film 225t in an area where the resist pattern 251 has not been formed is removed. Furthermore, if the etching stop layer 24 is thicker, an effect of forming the first p-type layer 225 and the second p-type layer 226 may be mitigated and it may be difficult to form a normally-off type, so that it is preferable for a film thickness of the etching stop layer 24 to be less than or equal to 15 nm.

Additionally, over-etching may be conducted for the etching stop layer 24 according to need. Furthermore, even if a part of the etching stop layer 24 remains on an area where the resist pattern 251 has not been formed, a characteristic of an HEMT is not influenced. Subsequently, the resist pattern 251 is removed by an organic solvent or the like so that it is possible to obtain a structure as illustrated in FIG. 7C.

Then, a source electrode 32 and a drain electrode 33 are formed on the etching stop layer 24, as illustrated in FIG. 8A.

Specifically, a photoresist is applied onto the second p-type layer 226 and the etching stop layer 24 and light exposure and development are conducted by a light exposure device, so that a resist pattern having openings in areas for forming the source electrode 32 and the drain electrode 33 are formed. Subsequently, a metal laminated film formed of Ta/Al (film thicknesses, Ta: 200 nm and Al: 200 nm) is film-formed by vacuum deposition, and afterward, dipped in an organic solvent, so that a metal laminated film formed on the resist pattern is removed with the resist pattern by lift-off. Thereby, the source electrode 32 and the drain electrode 33 are formed of a remaining metal laminated film. Subsequently, heat treatment is conducted at a temperature of 400° C.-1000° C., for example, at a temperature of 550° C., in nitrogen atmosphere, so that an ohmic contact is provided. Additionally, when it is possible to provide an ohmic contact without conducting heat treatment, no heat treatment may be conducted. Furthermore, a description of Ta/Al means a bilayer metal laminated film wherein a lower layer is Ta and an upper layer is Al. Furthermore, when the source electrode 32 and the drain electrode 33 are formed, the source electrode 32 and the drain electrode 33 may be formed after the etching stop layer 24 and a part of the electron supplying layer 23 in areas for forming the source electrode 32 and the drain electrode 33 are removed.

Then, a gate electrode 31 is formed on the second p-type layer 226 as illustrated in FIG. 8B.

Specifically, a photoresist is applied onto the second p-type layer 226 and the etching stop layer 24 and light exposure and development are conducted by a light exposure device, so that a resist pattern is formed that has an opening in an area where the gate electrode 31 is to be formed. Subsequently, a metal laminated film formed of Ni/Au (film thicknesses, Ni: 30 nm and Au: 400 nm) is film-formed by vacuum deposition, and afterward, dipped in an organic solvent, so that a metal laminated film formed on the resist pattern is removed with the resist pattern by lift-off. Thereby, the gate electrode 31 is formed of a metal laminated film remaining on the second p-type layer 226. Subsequently, heat treatment may be conducted according to need.

The gate electrode 31, the source electrode 32, and the drain electrode 33 may be a combination of metallic materials other than those described above, may be structures other than those described above, and may be formed of a monolayer metal film. Furthermore, for a method for forming the source electrode 31, the source electrode 32, and the drain electrode 33, formation thereof may be conducted by a method other than those described above.

As described above, it is possible to fabricate a semiconductor device in the present embodiment. Additionally, the contents other than those described above are similar to those of the first embodiment.

Third Embodiment

Next, a third embodiment will be described. The present embodiment is for a semiconductor device, a power supply device, and a high-frequency amplifier.

A semiconductor device in the present embodiment is provided by discretely packaging a semiconductor device in the first or second embodiment, and thus discretely packaged semiconductor device will be described based on FIG. 10. Additionally, FIG. 10 schematically illustrates an inside of the discretely packaged semiconductor device, wherein arrangement of electrodes or the like is different from those illustrated in the first or second embodiment.

First, a semiconductor device manufactured in the first or second embodiment is cut by dicing or the like to form a semiconductor chip 410 that is an HEMT of a GaN-type semiconductor material. Such a semiconductor chip 410 is fixed on a lead frame 420 by a die-attaching agent 430 such as a solder.

Then, a gate electrode 441 is connected to a gate lead 421 by a bonding wire 431, while a source electrode 442 is connected to a source lead 422 by a bonding wire 432 and a drain electrode 443 is connected to a drain lead 423 by a bonding wire 433. Additionally, the bonding wires 431, 432, and 433 are formed of a metal material such as Al. Furthermore, the gate electrode 441 in the present embodiment is a gate electrode pad that is connected to the gate electrode 31 in the first or second embodiment. Similarly, the source electrode 442 is a source electrode pad that is connected to the source electrode 32 and the drain electrode 443 is a drain electrode pad that is connected to the drain electrode 33.

Then, plastic sealing with a mold resin 440 is conducted by a transfer mold method. Thus, it is possible to fabricate a discretely packaged semiconductor device that is an HEMT using a GaN-type semiconductor material.

(PFC Circuit, Power Supply Device, and High-Frequency Amplifier)

Next, a PFC circuit, a power supply device, and a high-frequency amplifier in the present embodiment will be described. The PFC circuit, the power supply device, and the high-frequency amplifier in the present embodiment are a PFC circuit, a power supply device, and a high-frequency amplifier using the semiconductor device described in the first or second embodiment.

(PFC Circuit)

Next, a power factor correction (PFC) circuit in the present embodiment will be described. The PFC circuit in the present embodiment has a semiconductor device described in the first or second embodiment.

The PFC circuit in the present embodiment will be described based on FIG. 11. A PFC circuit 450 in the present embodiment has a switch element (transistor) 451, a diode 452, a choke coil 453, capacitors 454 and 455, a diode bridge 456, and an alternating current power supply that is not illustrated in the figure. An HEMT that is a semiconductor device described in the first or second embodiment is used for the switch element 451.

In the PFC circuit 450, a drain electrode of the switch element 451 is connected to an anode terminal of the diode 452 and one terminal of the choke coil 453. Furthermore, a source electrode of the switch element 451 is connected to one terminal of the capacitor 454 and one terminal of the capacitor 455, and the other terminal of the capacitor 454 is connected to the other terminal of the choke coil 453. The other terminal of the capacitor 455 is connected to a cathode terminal of the diode 452, and the alternating current power supply that is not illustrated in the figure is connected to both terminals of the capacitor 454 through the diode bridge 456. In such a PFC circuit 450, direct current (DC) is outputted between both terminals of the capacitor 455.

(Power Supply Device)

A power supply device in the present embodiment will be described based on FIG. 12. A power supply device 460 in the present embodiment includes a primary circuit 461 at a higher voltage, a secondary circuit 462 at a lower voltage, and a transformer 463 arranged between the primary circuit 461 and the second circuit 462. The primary circuit 461 includes an alternating current power supply 464, a so-called bridge rectifier circuit 465, a plurality of (four, in an example illustrated in FIG. 12) switching elements 466, one switching element 467, and the like. The secondary circuit 462 includes a plurality of (three, in an example illustrated in FIG. 12) switching elements 468. In an example illustrated in FIG. 12, semiconductor devices in the first or second embodiment are used as switching elements 466 and 467 of the primary circuit 461. Additionally, it is preferable for the switching elements 466 and 467 of the primary circuit 461 to be normally-off type semiconductor devices. Furthermore, a normal metal insulator semiconductor field effect transistor (MISFET) formed of silicon is used for the switching elements 468 used in the secondary circuit 462.

(High-Frequency Amplifier)

Furthermore, a high-frequency amplifier in the present embodiment will be described based on FIG. 13. A high-frequency amplifier 470 in the present embodiment may be applied to, for example, a power amplifier for a base station of a mobile phone. Such a high-frequency amplifier 470 includes a digital pre-distortion circuit 471, a mixer 472, a power amplifier 473, and a directional coupler 474. The digital pre-distortion circuit 471 compensates for nonlinear distortion of an input signal. The mixer 472 mixes an input signal compensated for nonlinear distortion with an alternating current signal. The power amplifier 473 amplifies the input signal mixed with the alternating current signal. In an example illustrated in FIG. 13, the power amplifier 473 has a semiconductor device described in the first or second embodiment. The directional coupler 474 conducts monitoring of an input signal or an output signal, or the like. In a circuit illustrated in FIG. 13, it is possible for the mixer 472 to mix an output signal with an alternating current signal to be transmitted to the digital pre-distortion circuit 471, due to, for example, switching of a switch.

According to a method for manufacturing a semiconductor device and a semiconductor device as disclosed in the above-mentioned embodiments, it is possible to remove only a p-type layer such as a p-GaN layer in an area except an area where a gate electrode is to be formed, without removing an electron supplying layer, so that it is possible to obtain a normally-off type semiconductor device with a lower on-resistance at a higher yield.

All examples and conditional language provided herein are intended for the pedagogical purposes of aiding the reader in understanding the invention and the concepts contributed by the inventor to further the art, and are not to be construed as limitations to such specially recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
   an electron transit layer formed on a substrate;
   an electron supplying layer formed on the electron transit layer;
   an etching stop layer formed on the electron supplying layer, the etching stop layer being formed of a material that includes GaN;
   a p-type layer formed on the etching stop layer, the p-type layer being formed in an area just under a gate electrode, the p-type layer being formed of a nitride semiconductor material that includes Al doped with an impurity element that attains p-type;
   the gate electrode formed on the p-type layer; and
   a source electrode and a drain electrode formed on the etching stop layer or the electron supplying layer or a combination thereof.

2. The semiconductor device as claimed in claim 1, wherein the p-type layer is formed of a material that includes AlGaN doped with an impurity element that attains p-type.

3. The semiconductor device as claimed in claim 1, wherein the p-type layer is a first p-type layer and a second p-type layer is formed of a nitride semiconductor material that includes no Al doped with an impurity element that attains p-type between the first p-type layer and the gate electrode.

4. The semiconductor device as claimed in claim 3, wherein the second p-type layer is formed of a material that includes GaN doped with an impurity element that attains p-type.

5. The semiconductor device as claimed in claim 1, wherein a thickness of the etching stop layer is 5 nm or greater and 15 nm or less.

6. A power supply device comprising the semiconductor device as claimed in claim 1.

7. An amplifier comprising the semiconductor device as claimed in claim 1.

8. A method of manufacturing a semiconductor device, comprising:
   laminating and forming an electron transit layer, an electron supplying layer, an etching stop layer, and a p-type film on a substrate sequentially, the p-type film being formed of a nitride semiconductor material that includes Al doped with an impurity element that attains p-type, the etching stop layer being formed of a material that includes GaN;
   removing the p-type film in an area except an area where a gate electrode is to be formed, by dry etching to form a p-type layer in the area where the gate electrode is to be formed, the dry etching being conducted while plasma emission in the dry etching is observed, the dry etching being stopped after the dry etching is started and plasma emission originating from Al is not observed; and
   forming the gate electrode on the p-type layer, and forming a source electrode and a drain electrode on the etching stop layer or the electron supplying layer or a combination thereof.

9. The method of manufacturing a semiconductor device as claimed in claim 8, wherein the p-type film is formed of a material that includes AlGaN doped with an impurity element that attains p-type.

10. The method of manufacturing a semiconductor device as claimed in claim 9, wherein the p-type film is formed of a material represented by p-$Al_xGa_{1-x}N$, wherein a value of X is $0<X\leq0.1$.

11. The method of manufacturing a semiconductor device as claimed in claim 8, wherein a thickness of the etching stop layer is 5 nm or greater and 15 nm or less.

12. The method of manufacturing a semiconductor device as claimed in claim 8, wherein the dry etching is a reactive ion etching.

13. The method of manufacturing a semiconductor device as claimed in claim 8, wherein observation of the plasma emission is conducted by a plasma emission spectrometer.

14. The method of manufacturing a semiconductor device as claimed in claim 8, wherein the electron transit layer is formed of a material that includes GaN and the electron supplying layer is formed of a material that includes AlGaN or InAlN or a combination thereof.

15. The method of manufacturing a semiconductor device as claimed in claim 8, wherein the impurity element that attains p-type is Mg or Be or a combination thereof.

16. A method of manufacturing a semiconductor device, comprising:
   laminating and forming an electron transit layer, an electron supplying layer, an etching stop layer, a first p-type film, and a second p-type film on a substrate sequentially, the second p-type film being formed of a material that includes GaN doped with an impurity element that attains p-type, the first p-type film being formed of a nitride semiconductor material that includes Al doped with an impurity element that attains p-type, the etching stop layer being formed of a material that includes GaN;
   removing the first p-type film and the second p-type film in an area except an area where a gate electrode is to be formed, by dry etching to form a first p-type layer and a second p-type layer on the area where the gate electrode is to be formed, the dry etching being conducted while plasma emission in the dry etching is observed, the dry etching being stopped after the dry etching is started and plasma emission originating from Al is observed and when the plasma emission originating from Al is not observed; and forming the gate electrode on the second p-type layer, and forming a source electrode and a drain electrode on the etching stop layer or the electron supplying layer or a combination thereof.

17. The method of manufacturing a semiconductor device as claimed in claim 16, wherein the first p-type film is formed of a material that includes AlGaN doped with an impurity element that attains p-type.

18. The method of manufacturing a semiconductor device as claimed in claim 17, wherein the first p-type film is formed of a material represented by $p\text{-}Al_xGa_{1-x}N$, wherein a value of X is $0<X\leq 0.1$.

19. The method of manufacturing a semiconductor device as claimed in claim 16, wherein a thickness of the first p-type film is 5 nm or greater and 15 nm or less.

* * * * *